(12) United States Patent
Hsu et al.

(10) Patent No.: US 9,706,656 B2
(45) Date of Patent: Jul. 11, 2017

(54) SIGNAL TRANSMISSION BOARD AND METHOD FOR MANUFACTURING THE SAME

(71) Applicant: INDUSTRIAL TECHNOLOGY RESEARCH INSTITUTE, Hsinchu (TW)

(72) Inventors: Chien-Min Hsu, Hsinchu County (TW); Shih-Hsien Wu, Taoyuan (TW); Jing-Yao Chang, New Taipei (TW); Tao-Chih Chang, Taoyuan (TW); Ren-Shin Cheng, Tainan (TW); Min-Lin Lee, Hsinchu (TW)

(73) Assignee: INDUSTRIAL TECHNOLOGY RESEARCH INSTITUTE, Hsinchu (TW)

(*) Notice: Subject to any disclaimer, the term of this patent is extended or adjusted under 35 U.S.C. 154(b) by 0 days.

(21) Appl. No.: 14/950,584

(22) Filed: Nov. 24, 2015

(65) Prior Publication Data
US 2016/0174360 A1   Jun. 16, 2016

(30) Foreign Application Priority Data
Dec. 15, 2014   (TW) .............................. 103143727 A

(51) Int. Cl.
*H05K 1/11* (2006.01)
*H05K 1/02* (2006.01)
*H05K 3/42* (2006.01)

(52) U.S. Cl.
CPC ........... *H05K 1/116* (2013.01); *H05K 1/0251* (2013.01); *H05K 3/42* (2013.01);
(Continued)

(58) Field of Classification Search
CPC combination set(s) only.
See application file for complete search history.

(56) References Cited

U.S. PATENT DOCUMENTS

| 4,524,247 | A | * | 6/1985 | Lindenberger | ......... H04R 19/01 257/418 |
| 4,569,876 | A | * | 2/1986 | Nakakita | ............... H01L 21/486 216/18 |

(Continued)

FOREIGN PATENT DOCUMENTS

| CN | 101489358 A | 7/2009 |
| EP | 0963603 B1 | 12/2003 |

(Continued)

OTHER PUBLICATIONS

Intellectual Property Office, Ministry of Economic Affairs, R. O. C,"Office Action", Sep. 9, 2016, Taiwan.
(Continued)

*Primary Examiner* — Timothy Thompson
*Assistant Examiner* — Krystal Robinson
(74) *Attorney, Agent, or Firm* — Locke Lord LLP; Tim Tingkang Xia, Esq.

(57) ABSTRACT

A signal transmission board includes a substrate, a conductive via, a cavity and a connecting hole. The substrate has a first external surface and a second external surface. The conductive via penetrating through the substrate has a first end and a second end. The first end is disposed on the first external surface, and the second end is disposed on the second external surface. The cavity is disposed in the substrate and penetrated by the conductive via. The connecting hole disposed on the substrate has a third end and a fourth end. The third end is disposed on the first external surface, and the fourth end communicates with the cavity.

21 Claims, 17 Drawing Sheets

(52) U.S. Cl.
CPC ............... *H05K 2201/0187* (2013.01); *H05K 2201/09545* (2013.01); *H05K 2203/1105* (2013.01); *H05K 2203/1178* (2013.01); *H05K 2203/143* (2013.01); *H05K 2203/1438* (2013.01)

(56) References Cited

U.S. PATENT DOCUMENTS

| | | | | |
|---|---|---|---|---|
| 4,985,600 | A * | 1/1991 | Heerman | H05K 1/116 |
| | | | | 174/255 |
| 5,355,102 | A * | 10/1994 | Kornrumpf | H01L 23/642 |
| | | | | 257/664 |
| 6,165,890 | A | 12/2000 | Kohl et al. | |
| 6,888,249 | B2 | 5/2005 | Kohl et al. | |
| 7,052,821 | B2 | 5/2006 | Kohl et al. | |
| 7,344,972 | B2 * | 3/2008 | Goodner | H01L 21/76808 |
| | | | | 257/E21.579 |
| 7,361,842 | B2 | 4/2008 | Brist et al. | |
| 7,400,214 | B2 | 7/2008 | Storniolo et al. | |
| 7,627,946 | B2 * | 12/2009 | Chou | H05K 3/243 |
| | | | | 174/260 |
| 7,767,913 | B2 * | 8/2010 | Corisis | H01L 23/66 |
| | | | | 174/260 |
| 7,829,993 | B2 * | 11/2010 | Murayama | B81C 1/0023 |
| | | | | 257/678 |
| 8,113,635 | B2 * | 2/2012 | Yamashita | B41J 2/14209 |
| | | | | 347/72 |
| 8,637,137 | B2 | 1/2014 | Joseph et al. | |
| 8,765,512 | B2 | 7/2014 | Kohl et al. | |
| 2002/0061154 | A1 * | 5/2002 | Tsukamoto | G02B 6/10 |
| | | | | 385/14 |
| 2003/0137056 | A1 * | 7/2003 | Taniguchi | H01L 23/49827 |
| | | | | 257/774 |
| 2004/0214427 | A1 * | 10/2004 | Kloster | H01L 21/3105 |
| | | | | 438/637 |
| 2005/0040497 | A1 * | 2/2005 | Takubo | H01L 21/30612 |
| | | | | 257/618 |
| 2005/0110543 | A1 * | 5/2005 | Touya | H01L 23/5222 |
| | | | | 327/165 |
| 2011/0090651 | A1 | 4/2011 | Jung et al. | |
| 2011/0304013 | A1 * | 12/2011 | Chen | H01F 17/0006 |
| | | | | 257/531 |
| 2013/0025119 | A1 | 1/2013 | Cases et al. | |

FOREIGN PATENT DOCUMENTS

| | | |
|---|---|---|
| TW | 511288 B | 11/2002 |
| TW | I283077 B | 6/2007 |
| TW | 200939394 A | 9/2009 |
| TW | I393490 B | 4/2013 |

OTHER PUBLICATIONS

Takasu, Y. et al., "Simulated high-frequency characteristics of coaxial via connection structures in printed circuit boards using three-dimensional electromagnetic field analysis", Electrical Design of Advanced Packaging & Systems Symposium, 2009, (EDAPS 2009), IEEE, pp. 1-4.

Aoyagi, M. et al., "Coaxial Wiring Structures in Printed Circuit Boards", Microsystems, Packaging, Assembly & Circuits Technology Conference, 2008, Impact 2008, 3rd International, pp. 325-328.

Todd J. Spencer et al., "Air-gap transmission lines for multiprocessor interconnects on FR-4 and BT substrates", IEEE, 2007, pp. 34-36.

Todd J. Spencer et al., "Air-Gap Transmission Lines on Organic Substrates for Low-Loss Interconnects", IEEE Transactions on Microwave Theory and Techniques, vol. 55, No. 9, 2007, pp. 1919-1925.

Seongho Park et al., "Air-Gaps for High-Performance On-Chip Interconnect Part I: Improvement in Thermally Decomposable Template", Journal of Electronic Materials, vol. 37, No. 10, 2008, pp. 1524-1533.

Seongho Park et al., "Air-Gaps for High-Performance On-Chip Interconnect Part II: Modeling, Fabrication, and Characterization", Journal of Electronic Materials, vol. 37, No. 10, 2008, pp. 1534-1546.

Todd J. Spencer, "Air-Gap Transmission Lines on Printed Circuit Boards for Chip-To-Chip Interconnections", Georgia Institute of Technology, 2010.

* cited by examiner

SIGNAL TRANSMISSION BOARD AND METHOD FOR MANUFACTURING THE SAME

CROSS-REFERENCE TO RELATED APPLICATIONS

This non-provisional application claims priority under 35 U.S.C. §119(a) on Patent Application No(s). 103143727 filed in Taiwan, R.O.C. on Dec. 15, 2014, the entire contents of which are hereby incorporated by reference.

TECHNICAL FIELD

The disclosure relates to a signal transmission board and a method for manufacturing the same.

BACKGROUND

With development of technology of high-level servers, the transmission speed and quality of signals transmitted by a signal transmission board, e.g., a printed circuit board (PCB), are highly demanded.

A circuit board includes a transmission wire and a plated through hole (PTH). The transmission wire is used for signal transmission in a horizontal direction. The PTH is used for signal transmission in a vertical direction such that the signal can be transmitted through several stacked layers. However, the PTH in vertical direction has impedance mismatch with the transmission wire in horizontal direction, which reduces the speed and quality of the signal transmission. Specifically, when the PTH has impedance mismatch with the transmission wire and a signal is transmitted through several layers in the transmission wire and the PTH, the signal may be undesirably reflected due to the differences between the impedances of the PTH and the transmission wire. Thus, this causes loss and noise of the signal transmission.

SUMMARY

One embodiment of the disclosure provides a signal transmission board including a substrate, a cavity, a conductive via and a connecting hole. The substrate has a first external surface and a second external surface that are opposite to each other. The cavity is disposed in the substrate. The conductive via has a first end and a second end that are opposite to each other. The conductive via penetrates through the first external surface of the substrate, the cavity and the second external surface of the substrate in sequence. The first end of the conductive via is disposed on the first external surface, and the second end of the conductive via is disposed on the second external surface. The connecting hole has a third end and a fourth end that are opposite to each other. The connecting hole is disposed on the substrate. The third end of the connecting hole is disposed on the first external surface, and the fourth end of the connecting hole communicates with the cavity.

Another embodiment of the disclosure provides a method for manufacturing a signal transmission board including the following steps. A thermal decomposable material is disposed in a substrate with a first external surface and a second external surface. The thermal decomposable material is separated from the first external surface and the second external surface by distances, respectively. A through hole extending through the substrate and the thermal decomposable material is formed. The through hole has a first end disposed on the first external surface of the substrate and a second end disposed on the second external surface of the substrate. An inner conductive film is plated on a sidewall of the through hole to form a conductive via. A connecting hole extending from the first external surface of the substrate toward the thermal decomposable material is formed. The thermal decomposable material is removed through the connecting hole by vaporization so as to form a cavity in the substrate, and the conductive via penetrates through the cavity.

BRIEF DESCRIPTION OF THE DRAWINGS

The disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1A:
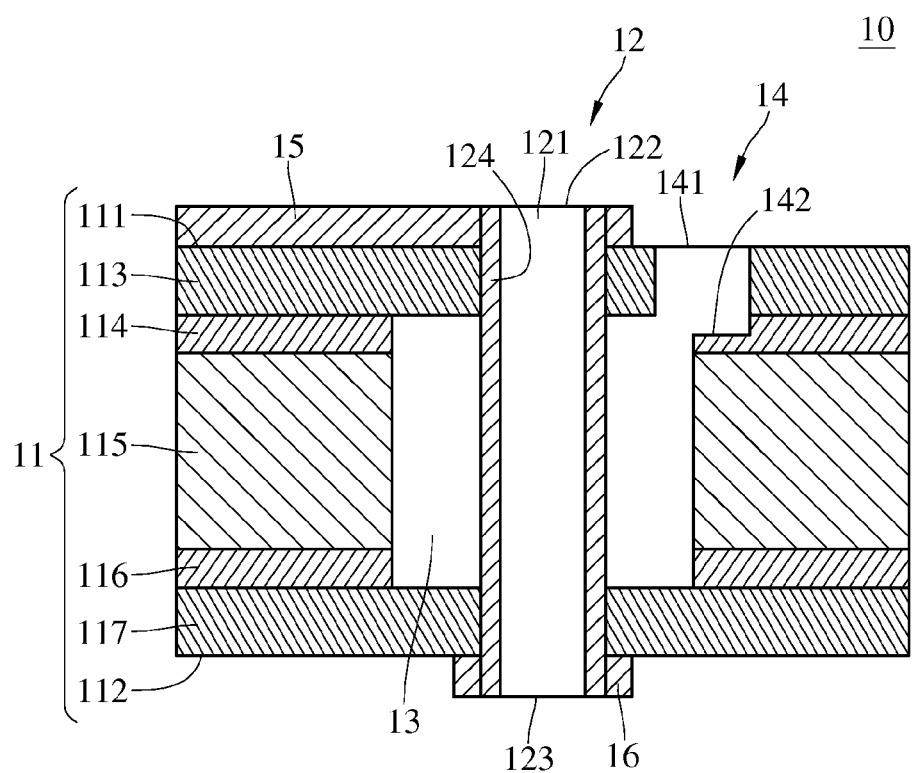
FIG. 1A is a cross-sectional view of a signal transmission board according to an embodiment of the disclosure.
Figure 1B:
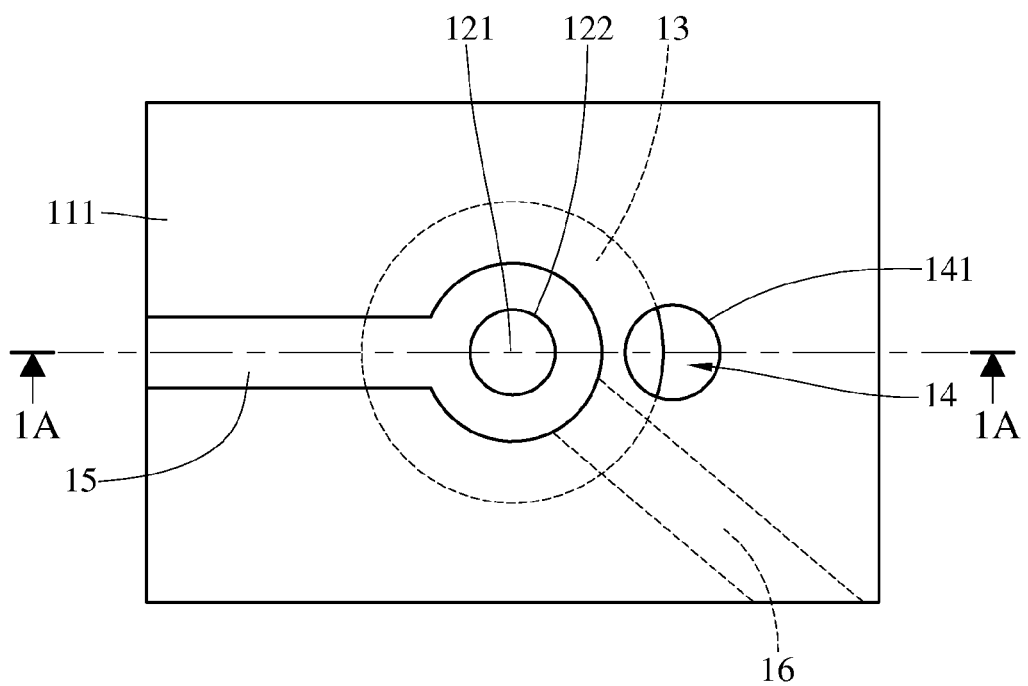
FIG. 1B is a top view of the signal transmission board according to an embodiment of the disclosure.
Figure 2:
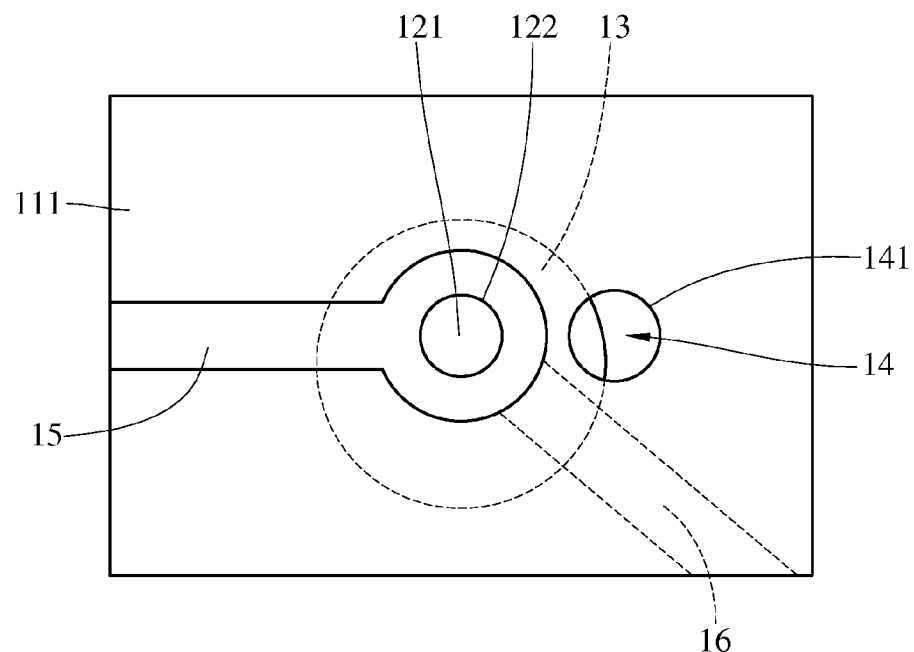
FIG. 2 is a top view of a signal transmission board according to another embodiment of the disclosure.
Figure 3:
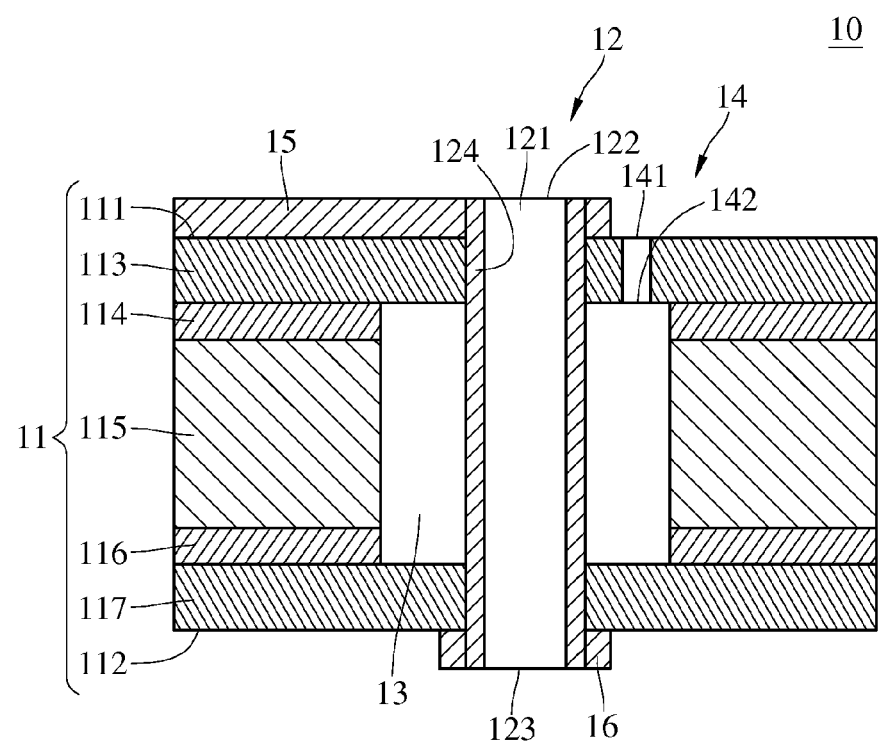
FIG. 3 is a cross-sectional view of the signal transmission board according to another embodiment of the disclosure.

Refer to FIG. 1A, FIG. 1B, FIG. 2 and FIG. 3, FIG. 1A is a cross-sectional view of a signal transmission board according to an embodiment of the disclosure, and FIG. 1B is a top view of the signal transmission board according to an embodiment of the disclosure, FIG. 2 is a top view of a signal transmission board according to another embodiment of the disclosure, and FIG. 3 is a cross-sectional view of the signal transmission board according to another embodiment of the disclosure. As shown in FIG. 1A, the signal transmission board 10 can be applied in a field of printed circuit boards (PCBs). Traces, i.e., circuits, can be printed on a surface thereof and electronic components can be disposed on the surface. Thus, signals generated by the electronic components can be transmitted through the traces and PTHs of the signal transmission board 10.

In this embodiment, the signal transmission board 10 includes a substrate 11, a conductive via 12, a cavity 13 and a connecting hole 14. Specifically, the substrate 11 has a first external surface 111 and a second external surface 112 that are opposite to each other. In this and some other embodiments, the first external surface 111 and the second external surface 112 are a top surface and a bottom surface of the substrate 11, respectively. Moreover, in this and some other embodiments, the substrate 11 is a multilayer substrate. The substrate 11 includes, from the first external surface 111 to the second external surface 112 in order, a first insulation layer 113, a first electrically conductive layer 114, a base layer 115, a second electrically conductive layer 116 and a second insulation layer 117. In detail, the first external surface 111 of the substrate 11 is a surface of the first insulation layer 113 away from the base layer 115, and the first electrically conductive layer 114 is disposed between the first insulation layer 113 and the base layer 115. The second external surface 112 of the substrate 11 is a surface of the second insulation layer 117 away from the base layer 115, and the second electrically conductive layer 116 is disposed between the second insulation layer 117 and the base layer 115. As shown in FIG. 1, for example, the base layer 115 is made of an electrically insulated material.

In this embodiment, for example, the signal transmission board 10 further includes a first trace 15 and a second trace 16. The first trace 15 is disposed on the first external surface 111 of the substrate 11. The second trace 16 is disposed on the second external surface 112. Multiple electronic components can be disposed on the first external surface 111 and the second external surface 112 of the substrate 11, and the electronic components can be electrically coupled to each other through the first trace 15 and the second trace 16. However, the disclosure is not limited to the configurations of the first trace 15 and the second trace 16. In other words, in other embodiments, there are no the first trace 15 and the second trace 16 disposed on the first external surface 111 and the second external surface 112. In other embodiments, a plurality of first traces 15 and a plurality of second traces 16 are disposed on the first external surface 111 and the second external surface 112 of the substrate 11, respectively.

The conductive via 12 penetrates through the substrate 11, and the conductive via 12 has a first end 122 and a second end 123 that are opposite to each other. As shown in FIG. 1A through FIG. 3, a through hole 121 extends through not only the substrate 11 but also the first trace 15 and the second trace 16. That is, the first end 122 of the through hole 121 is disposed on the surface of the first trace 15, and the second end 123 of the through hole 121 is disposed on the surface of the second trace 16. In other embodiments, when no first trace 15 and second trace 16 are disposed at the through hole 121, the first end 122 of the through hole 121 is disposed on the first external surface 111 of the substrate 11, and the second end 123 of the through hole 121 is disposed on the second external surface 112 of the substrate 11.

In an embodiment shown in FIG. 1A through FIG. 3, in terms of the conductive via 12, the conductive via 12 may be formed by any suitable method, such as drilling a through hole 121 in the substrate 11 and plating the through hole 121 with an inner conductive film 124. The conductive via 12 extends through the first insulation layer 113, the first electrically conductive layer 114, the base layer 115, the second electrically conductive layer 116 and the second insulation layer 117. Furthermore, the first trace 15 can be connected to the inner conductive film 124 disposed on the first end 122 of the conductive via 12. The second trace 16 can be connected to the inner conductive film 124 disposed on the second end 123 of the conductive via 12. Since the first trace 15 and the second trace 16 are respectively connected to the inner conductive film 124 of the conductive via 12, the electronic components (not shown) disposed on the first external surface 111 of the substrate 11 are electrically coupled to the electronic components (not shown) disposed on the second external surface 112. In one embodiment, the quantity of the conductive via 12 disposed on the substrate 11 can be one or more than one, and the positions where the conductive via 12 is disposed can be properly arranged according to different designs, and the disclosure is not limited thereto.

The cavity 13 is disposed in the substrate 11 and separated from the first external surface 111 and the second external surface 112 by distances, respectively. In this embodiment, in detail, the cavity 13 can be disposed in the first electrically conductive layer 114, the base layer 115 and the second electrically conductive layer 116 of the substrate 11, and the cavity 13 can be disposed between the first insulation layer 113 and the second insulation layer 117. In other words, the cavity 13 is disposed within the first electrically conductive layer 114, the base layer 115 and the second electrically conductive layer 116 and does not extend through the first insulation layer 113 and the second insulation layer 117. The inner conductive film 124 is not in direct contact with the first electrically conductive layer 114, the base layer 115 and the second electrically conductive layer 116. Also, the cavity 13 and the first external surface 111 are separated by a thickness of the first insulation layer 113, and the cavity 13 and the second external surface 112 are separated by a thickness of the second insulation layer 117. In other words, the cavity 13 is disposed in inner layers of the substrate 11 and does not expose to the outside of the signal transmission board 10.

In addition, the conductive via 12 is disposed within the cavity 13. In an embodiment, as shown in FIG. 1B, the cavity 13 and the conductive via 12 are coaxial. Accordingly, the inner wall of the cavity 13 and those of the conductive via 12 are separated by a constant distance. However, the disclosure is not limited to the coaxial structure of the cavity 13 and the conductive via 12. In other embodiments, as shown in FIG. 2 the cavity 13 is eccentric to the conductive via 12, and the conductive via 12 is still disposed within the cavity 13. Moreover, as shown in FIG. 1A, the connecting hole 14 has a third end 141 and a fourth end 142 that are opposite to each other. The connecting hole 14 extends from the first external surface 111 of the substrate 11 toward the cavity 13. The third end 141 of the connecting hole 14 is disposed on the first external surface 111 of the substrate 11, and the fourth end 142 of the connecting hole 14 communicates with the cavity 13. Accordingly, the cavity 13 can communicate with the external environment outside the substrate 11 through the connecting hole 14.

The connecting hole 14 in one embodiment extends through the first insulation layer 113 and a part of the first electrically conductive layer 114, such that the connecting hole 14 communicates with the cavity 13. However, the disclosure is not limited to the communication between the connecting hole 14 and the cavity 13. In other embodiments, the connecting hole 14 can directly extend through the first insulation layer 113 to communicate with the cavity 13, as shown in FIG. 3. In other embodiments, the connecting hole 14 can extend through the first insulation layer 113 and the first electrically conductive layer 114 such that the fourth end 142 is disposed at a contact surface between the first electrically conductive layer 114 and the base layer 115. In other embodiments, the connecting hole 14 can extend through the first insulation layer 113, the first electrically conductive layer 114 and a part of the base layer 115. In other embodiments, the connecting hole 14 can extend through the first insulation layer 113, and the first electrically conductive layer 114 and the base layer 115 such that the fourth end 142 of the connecting hole 14 is disposed at a contact surface between the base layer 115 and the second electrically conductive layer 116. In other embodiments, the connecting hole 14 can extend through the first insulation layer 113, the first electrically conductive layer 114, the base layer 115 and a part of the second electrically conductive layer 116. The disclosure is not limited to the extension of the connecting hole 14. The connecting hole 14 communicating the cavity 13 and the external environment outside the substrate 11 falls within the scope of the disclosure. In addition, the disclosure is not limited to the quantity and position of connecting hole 14. In other embodiments, the quantity of the connecting hole 14 can be more than one. Alternatively, the third end 141 of the connecting hole 14 is disposed on the second external surface 112. The connecting hole 14 extends through the second insulation layer 117 and the second electrically conductive layer 116 in order to make the fourth end 142 of the connecting hole 14 communicate with the cavity 13.

In the disclosure, the phrase "A communicates with B" is defined that two rooms A and B are connected to each other such that air or certain gas is able to circulate in the two rooms A and B.

Furthermore, in an embodiment, the cavity 13 is full of air. Since the air has relatively low dielectric constant (i.e., permittivity), the air inside the cavity 13 can enhance the characteristic impedance of the conductive via 12. That is, the impendence of the conductive via 12 matches with the transmission wire, i.e., the first trace 15 and second trace 16. Hence, when signals are transmitted through the signal transmission board 10, the impedances of the vertical paths, i.e., along the conductive via 12, or horizontal paths, i.e., along the first trace 15 and second trace 16, are substantially the same, which reduces the discontinuity of impedances of the transmission path.

In one embodiment, the disclosure is not limited to the material disposed in the cavity 13 being air. For example, the cavity 13 can be filled with a material with a low dielectric constant or another material with a high dielectric constant. In one embodiment, the low dielectric constant is defined as being lower than that of the first insulation layer 113 or that of the second insulation layer 117. The high dielectric constant is defined as being higher than that of the first insulation layer 113 or that of the second insulation layer 117. For example, a dielectric material with low dielectric constant is air or other materials with low loss tangent. For example, a dielectric material with high dielectric constant is $SiO_2$, $Ta_2O_5$, $BaTiO_3$ or other dielectric material with high dielectric constant. When the cavity 13 is filled with a dielectric material with a low dielectric constant, the characteristic impedance of the conductive via 12 is enhanced. When the cavity 13 is filled with a dielectric material with a high dielectric constant, the characteristic impedance of the conductive via 12 can be reduced. Thus, the signal transmission board 10 can be applied in different kinds of fields. The dielectric material in the cavity 13 can be a solid, liquid or gas.

Figure 4:
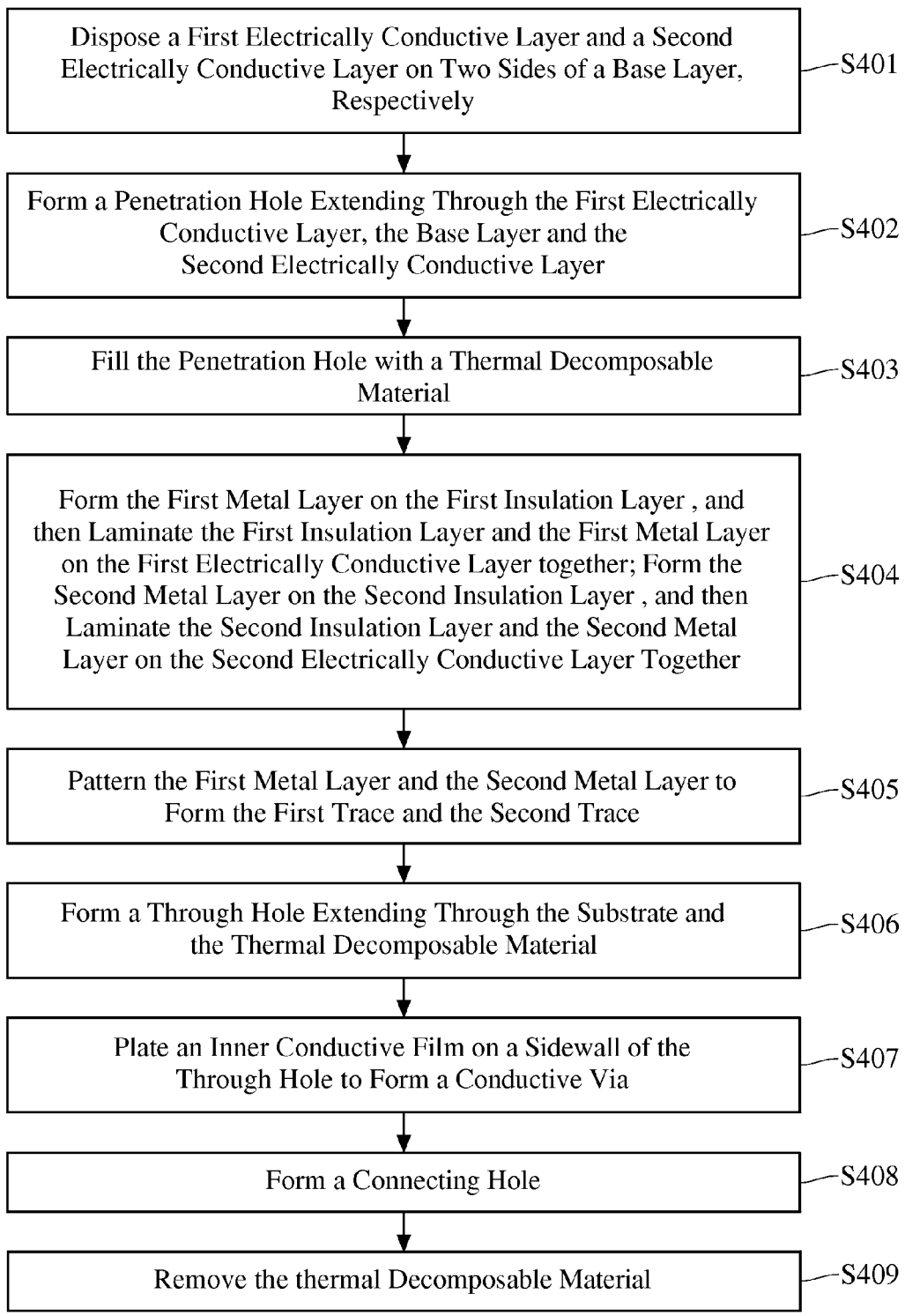
FIG. 4 is a flow chart of a method for manufacturing the signal transmission board of FIG. 1.
Figure 5A:
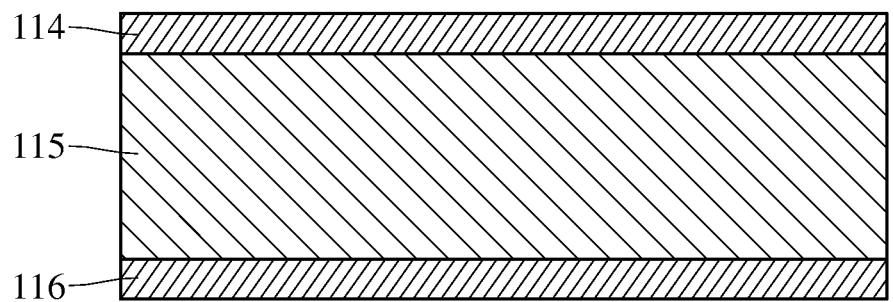
FIG. 5A through FIG. 5I are the steps of a manufacturing process of the signal transmission board of FIG. 4.
Figure 5B:
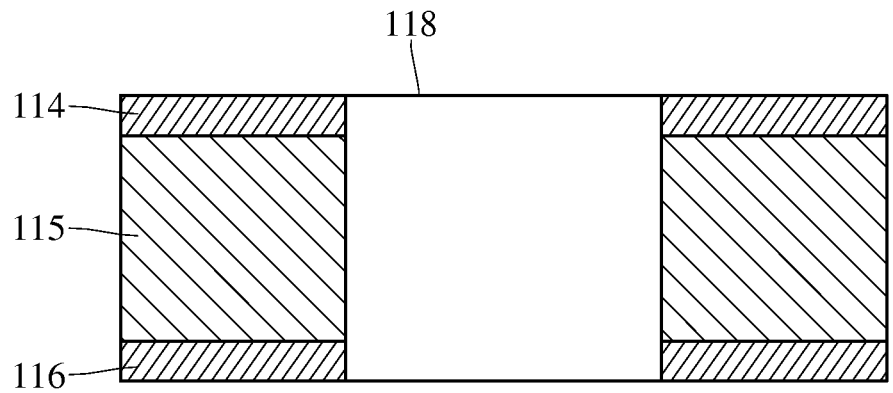
Figure 5C:
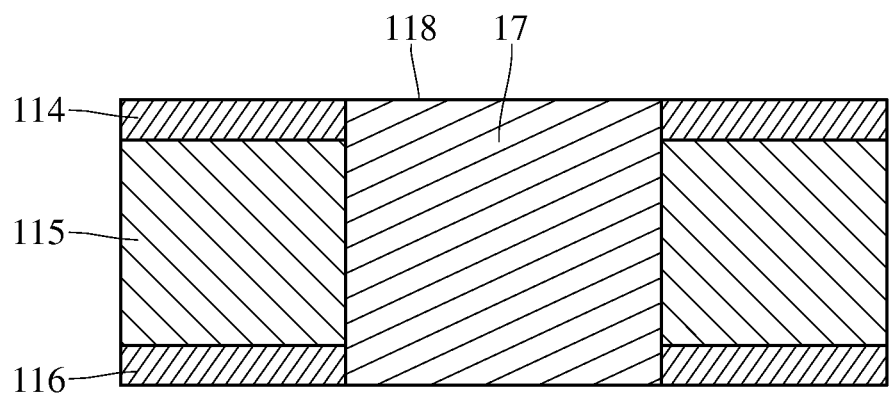

The following describes the method for manufacturing the signal transmission board 10 shown in FIGS. 1A and 1B. Please refer to FIG. 4 and FIG. 5A through FIG. 5I. FIG. 4 is a flow chart of a method for manufacturing the signal transmission board of FIG. 1A, and FIG. 5A through FIG. 5I are the steps of a manufacturing process of the signal transmission board of FIG. 4. As shown in FIG. 5A through FIG. 5C, a thermal decomposable material 17 is disposed in the substrate 11. At Steps S401, S402 and S403, the thermal decomposable material 17 is disposed in the substrate 11.

Firstly, at Step S401 and as shown in FIG. 5A, the first electrically conductive layer 114 and the second electrically conductive layer 116 are disposed on two sides of the base layer 115 that are opposite to each other, respectively. The first electrically conductive layer 114 and the second electrically conductive layer 116 can be made of cooper or other conductive materials. Afterwards, at Step S402 and as shown in FIG. 5B, a penetration hole 118 is formed and extended through the first electrically conductive layer 114, the base layer 115 and the second electrically conductive layer 116. Then, at Step S403 and as shown in FIG. 5C, the penetration hole 118 is filled with the thermal decomposable material 17.

Figure 5D:
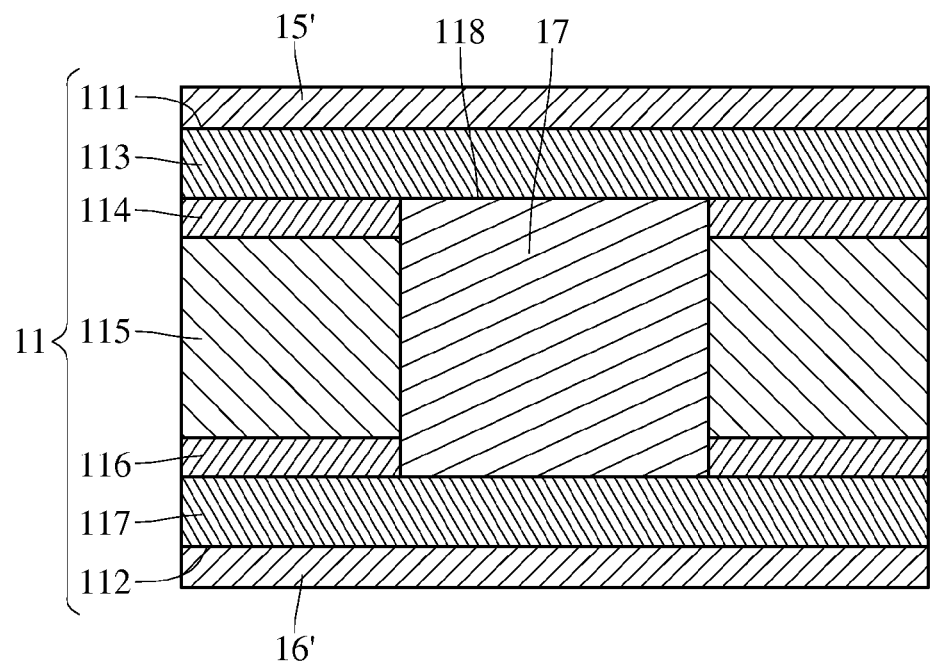

Next, at Step S404 and as shown in FIG. 5D, the first metal layer 15' is formed on the first insulation layer 113, and then the first insulation layer 113 and the first metal layer 15' are laminated on the first electrically conductive layer 114. The second metal layer 16' is formed on the second insulation layer 117, and then the second insulation layer 117 and the second metal layer 16' are laminated on the second electrically conductive layer 116. The first metal layer 15' and the second metal layer 16' can be made of cooper or other conductive materials. In detail, at Step S404, the first metal layer 15' is formed on the first insulation layer 113, and then the first insulation layer 113 and the first metal layer 15' are laminated on a side of the first electrically conductive layer 114, which is away from the base layer 115, together. In other words, the first electrically conductive layer 114 is disposed between the first insulation layer 113 and the base layer 115, and a part of the first insulation layer 113 is disposed between the first metal layer 15' and the first electrically conductive layer 114. Also, the first insulation layer 113 covers the first electrically conductive layer 114 and one side of the thermal decomposable material 17. In addition, the second metal layer 16' is formed on the second insulation layer 117, and then the second insulation layer 117 and the second metal layer 16' are laminated on a side of the second electrically conductive layer 116, which is away from the base layer 115, together. In other words, the second electrically conductive layer 116 is disposed between the second insulation layer 117 and the base layer 115, and a part of the second insulation layer 117 is disposed between the second metal layer 16' and the second electrically conductive layer 116. Also, the second insulation layer 117 covers the second electrically conductive layer 116 and the other side of the thermal decomposable material 17. That is, the thermal decomposable material 17 is encircled by the first electrically conductive layer 114, the base layer 115 and the second electrically conductive layer 116, and the thermal decomposable material 17 is disposed between and in contact with the first insulation layer 113 and the second insulation layer 117. Consequently, the thermal decomposable material 17 is disposed in the substrate 11.

Figure 5E:
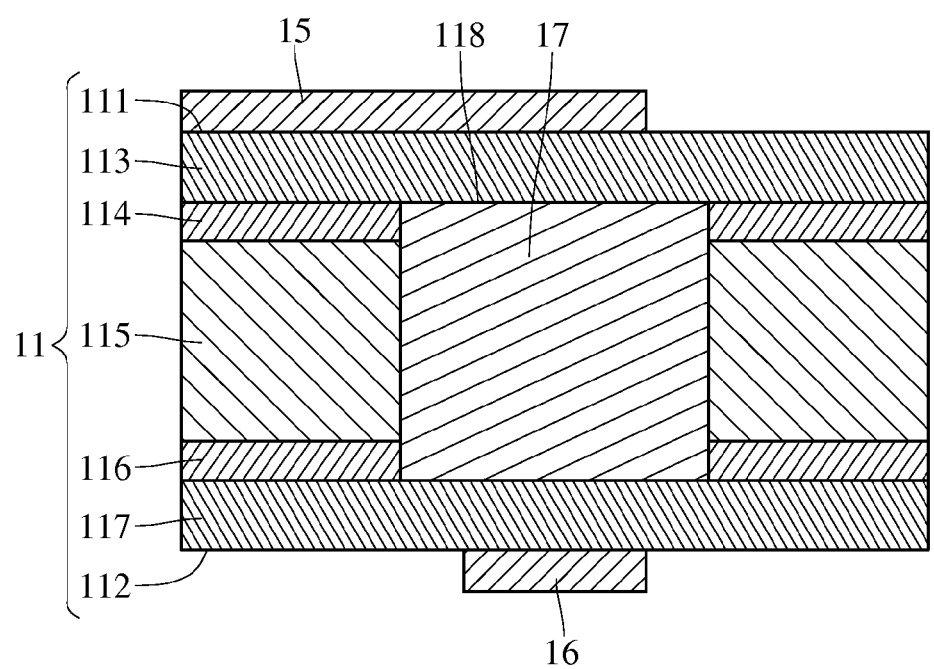

Then, Step S405 is performed. As shown in FIG. 5E, the first metal layer 15' and the second metal layer 16' are patterned to form the first trace 15 and the second trace 16 according to design of circuitry. The first trace 15 and the second trace 16 can be made of cooper or other conductive materials. However, the disclosure is not limited to the step of disposing the first metal layer 15' and the second metal layer 16'. In other embodiments, the first metal layer 15' and the second metal layer 16' are not formed, which means Steps S404 and S405 can be omitted.

Figure 5F:
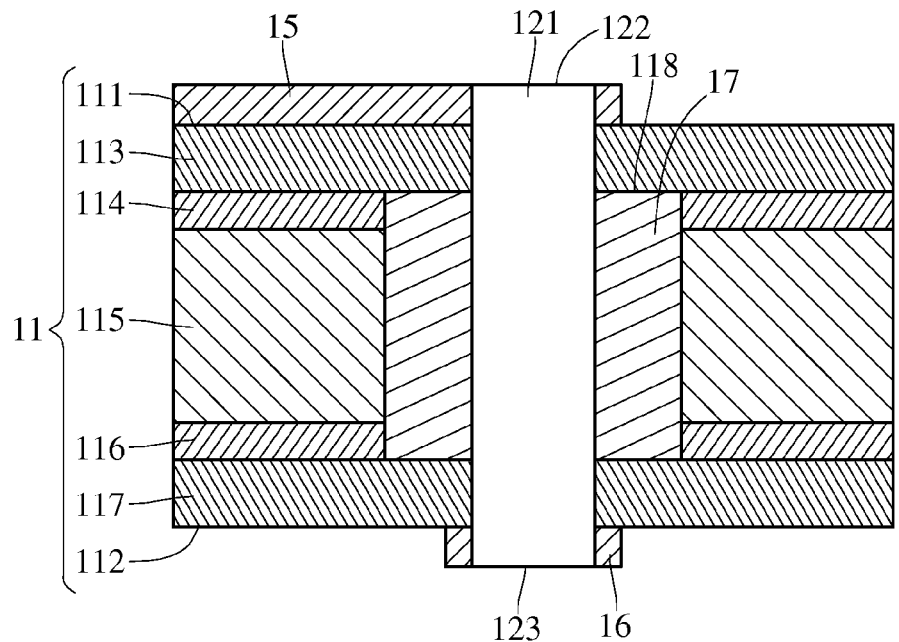

Afterwards, Step S406 is performed. As shown in FIG. 5F, the through hole 121 is formed on the substrate 11 and extended through the substrate 11 and the thermal decomposable material 17. In the embodiments shown in FIG. 5F, the through hole 121 not only extends through the substrate 11 but also the first trace 15 and the second trace 16 such that the first end 122 and the second end 123 of the through hole 121 are disposed on the first trace 15 and the second trace 16, respectively. In other embodiments, as the first trace 15 and the second trace 16 are not disposed on the first insulation layer 113 and the second insulation layer 117, respectively, the first end 122 and the second end 123 of the through hole 121 are disposed on the first external surface 111 and the second external surface 112 of the substrate 11, respectively. In the embodiments shown in FIG. 5F, the through hole 121 extends through the first trace 15, the first insulation layer 113, the thermal decomposable material 17, the second insulation layer 117 and the second trace 16.

Figure 5G:
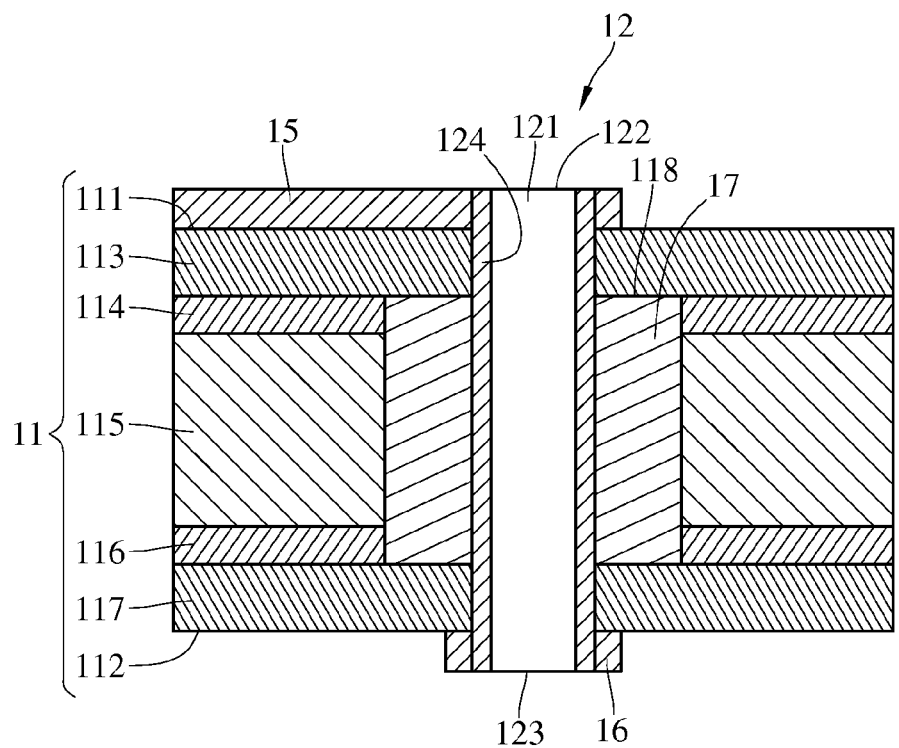

Then, Step S407 is performed. As shown in FIG. 5G, an inner conductive film 124 is formed on the inner sidewall of the through hole 121 to form the conductive via 12. The inner conductive film 124 can be made of cooper or other conductive materials. A part of the inner conductive film 124 disposed at the first end 122 of the conductive via 12 is electrically coupled to the first trace 15 on the first external surface 111. Another part of inner conductive film 124 disposed at the second end 123 of the conductive via 12 is electrically coupled to the second trace 16 on the second external surface 112. Thus, the first trace 15 and the second trace 16 are coupled to each other through the conductive via 12. Consequently, the signals can be transmitted and received from the electronic components disposed on the first external surface 111 to the electronic components disposed on the second external surface 112 through the conductive via 12.

Figure 5H:
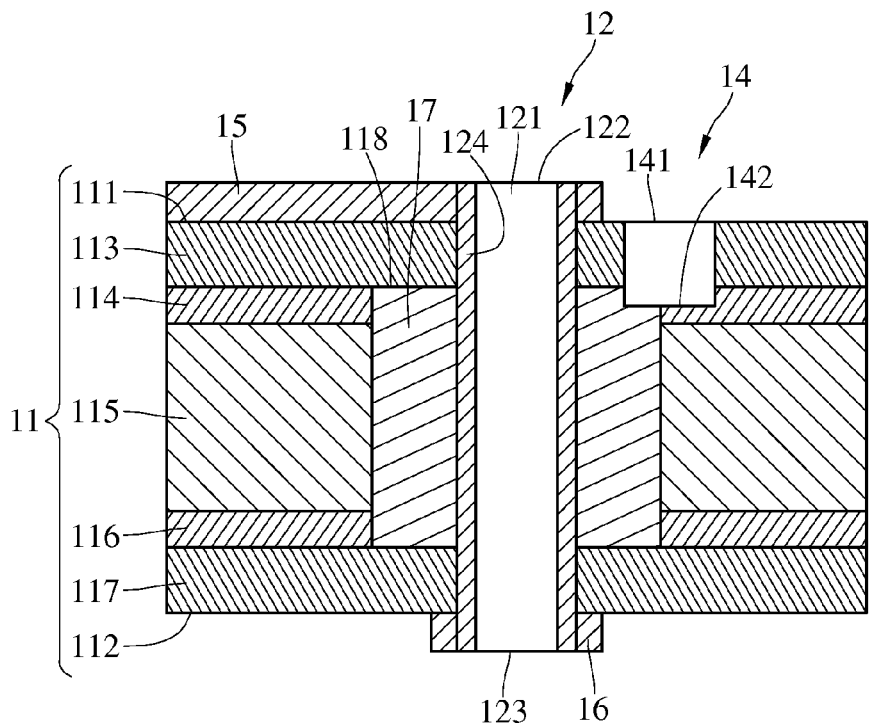

Then, Step S408 is performed. As shown in FIG. 5H, the connecting hole 14 is formed on the substrate 11, and the connecting hole 14 extends from the first external surface 111 to the thermal decomposable material 17. In detail, the connecting hole 14 has the third end 141 and the fourth end 142. The third end 141 of the connecting hole 14 is disposed on the first external surface 111, and the fourth end 142 of the connecting hole 14 is connected to the thermal decomposable material 17. The disclosure is not limited to the above-mentioned position, quantity and deepness of the connecting hole 14. The connecting hole 14 falls in the scope of the disclosure is that the fourth end 142 of the connecting hole 14 is connected to the thermal decomposable material 17, and the third end 141 of the connecting hole 14 can be exposed to the outside of the substrate 11 to communicate with the outside of the signal transmission board 10.

Figure 5I:
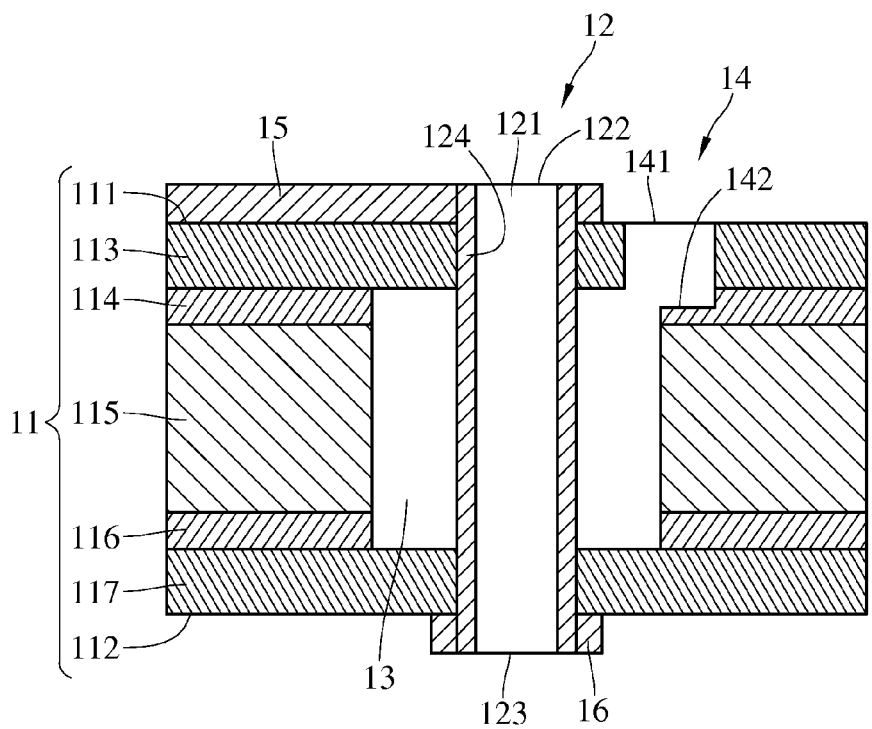

Afterwards, Step S409 is performed. As shown in FIG. 5I, the thermal decomposable material 17 is removed through the connecting hole 14 by vaporization. Thus, the cavity 13, which is penetrated by the conductive via 12, is formed in the substrate 11. At Step S409, the vaporization temperature of the thermal decomposable material 17 is higher than the temperatures of pressing and curing of the first insulation layer 113 and those of the second insulation layer 117. The thermal decomposable material 17 is heated to gradually convert to be gas state. The thermal decomposable material 17 flows to the outside of the substrate 11 through the connecting hole 14. After the thermal decomposable material 17 is vaporized, the space which originally stores the thermal decomposable material 17 becomes the cavity 13. Accordingly, the manufacturing of the signal transmission board 10 according to the embodiments of the disclosure is finished. For example, the vaporization temperature of the thermal decomposable material made by Empower Company is 300 degrees Celsius. Different kinds of thermal decomposable materials have different vaporization conditions. However, the disclosure is not limited to the vaporization conditions, e.g., the vaporization temperature in this embodiment.

In one embodiment, the cavity 13 is full of air. Because the conductive via 12 is surrounded with the air in the cavity 13, the characteristic impedance of the conductive via 12 can be enhanced. Thus, the impedance of the conductive via 12 matches with that of the horizontal transmission wire, e.g., the first trace 15 and the second trace 16. Accordingly, the quality and speed of signal transmission of the signal transmission board 10 are improved.

Figure 6:
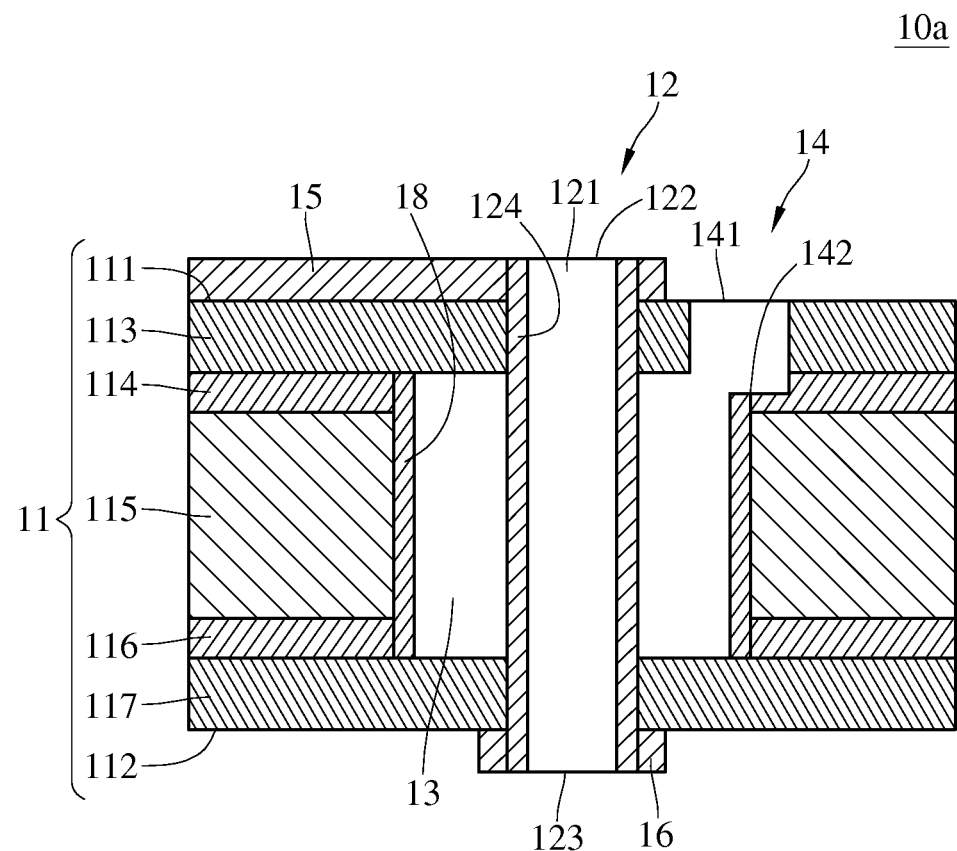
FIG. 6 is a cross-sectional view of a signal transmission board according to yet another embodiment of the disclosure.

Please refer to FIG. 6, which is a cross-sectional view of a signal transmission board according to yet another embodiment of the disclosure. The signal transmission board 10a shown in FIG. 6 includes the substrate 11, the conductive via 12, the cavity 13 and the connecting hole 14, these components are similar to those described in the above-mentioned signal transmission board 10. Also, the configuration of the signal transmission board 10a is similar to that of the signal transmission board 10. The difference between this embodiment and the signal transmission board 10 shown in FIG. 1A is that the signal transmission board 10a further includes an external conductive film 18. The external conductive film 18 is formed on a sidewall of the cavity 13 surrounded by the first electrically conductive layer 114, the base layer 115 and the second electrically conductive layer 116. The external conductive film 18 can be made of cooper or other conductive materials. Moreover, the external conductive film 18 is electrically coupled to the first electrically conductive layer 114 and the second electrically conductive layer 116 such that the first electrically conductive layer 114 is electrically coupled to the second electrically conductive layer 116.

Figure 7:
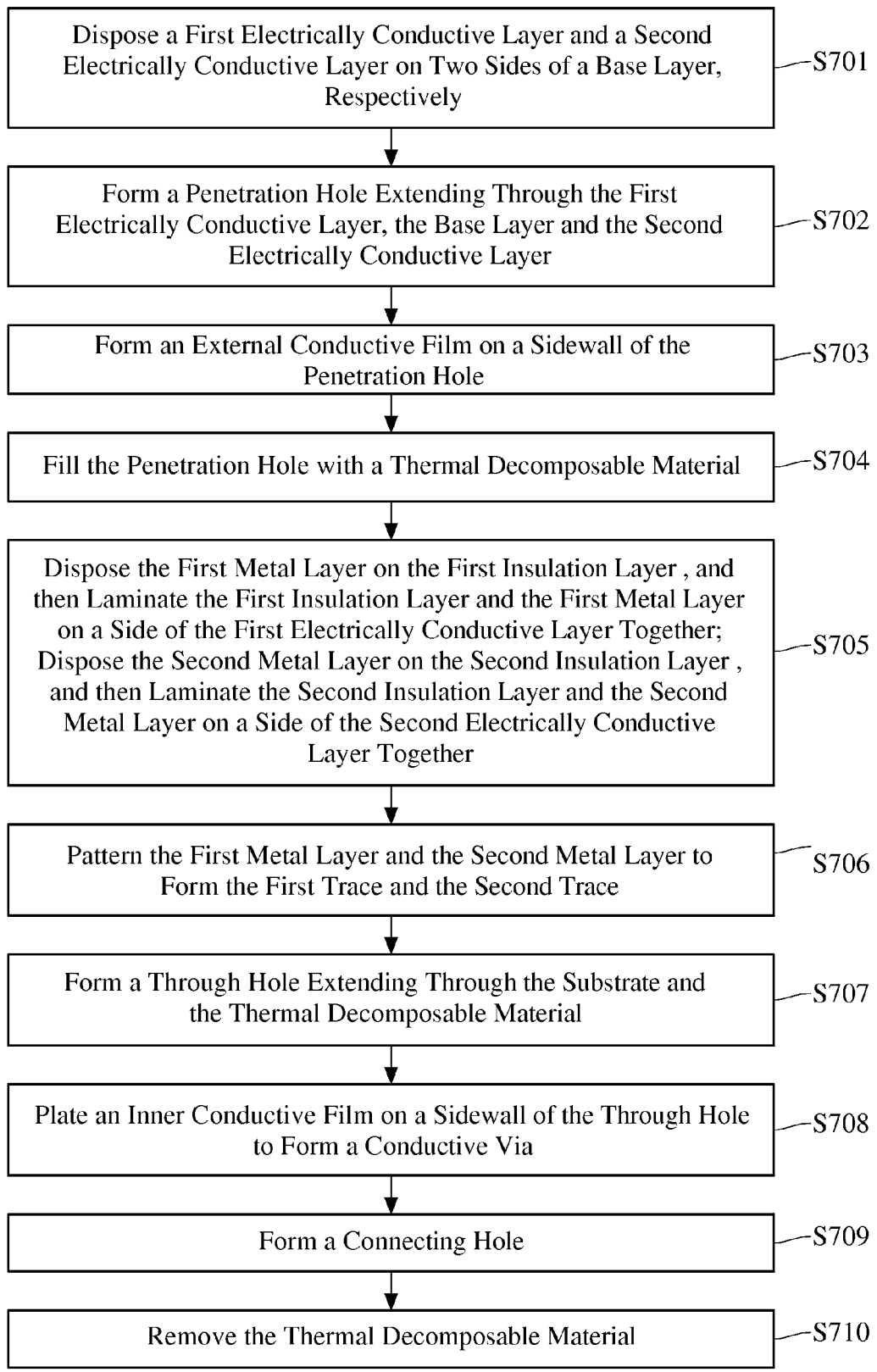
FIG. 7 is a flow chart of a method for manufacturing the signal transmission board of FIG. 4.

Please refer to FIG. 7 and FIG. 8A through FIG. 8J. FIG. 7 is a flow chart of a method for manufacturing the signal transmission board of FIG. 6, and FIG. 8A through FIG. 8J are the steps of a manufacturing process of the signal transmission board of FIG. 7. The difference between the method of manufacturing the signal transmission board shown in FIG. 7 and that in FIG. 4 is that the method in this embodiment further comprises the step of plating the external conductive film 18.

Figure 8A:
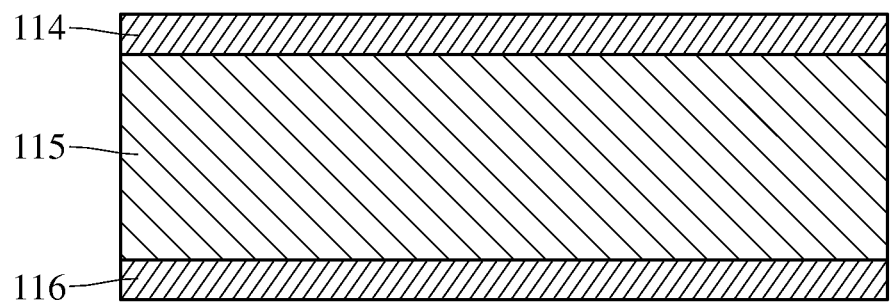
FIG. 8A through FIG. 8J are the steps of a manufacturing process of the signal transmission board of FIG. 7.
Figure 8B:
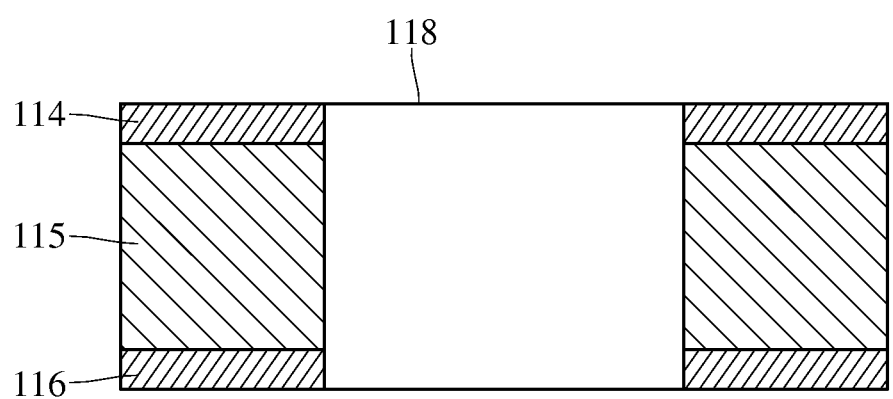
Figure 8C:
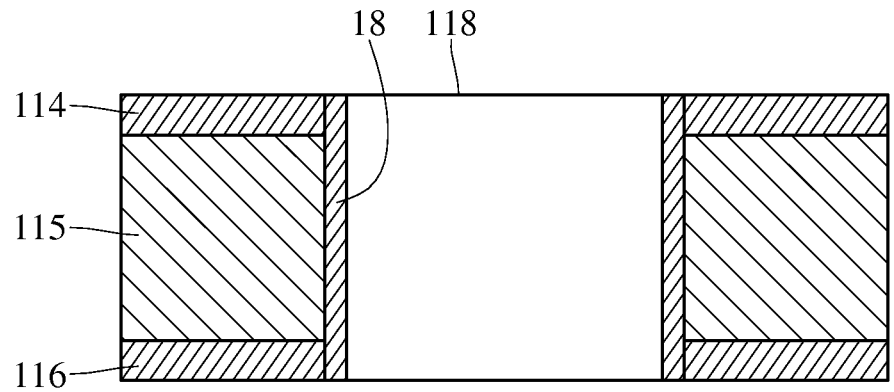
Figure 8D:
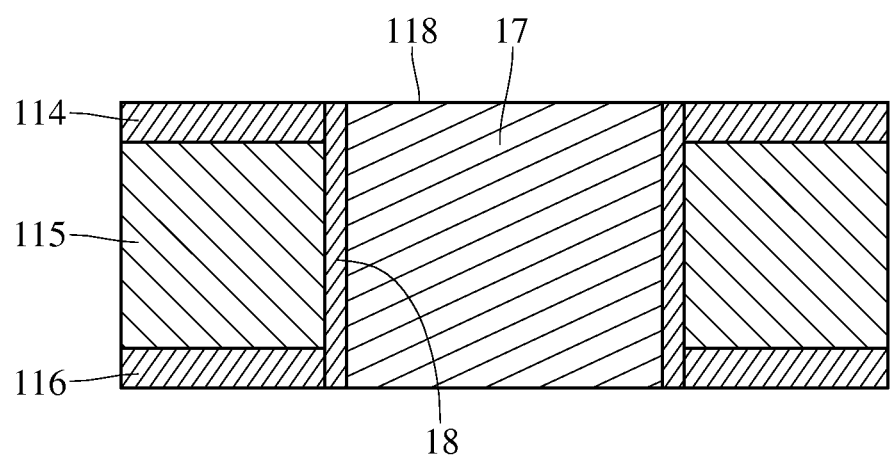

Firstly, Step S701 is performed. As shown in FIG. 8A, the first electrically conductive layer 114 and the second electrically conductive layer 116 are disposed on two sides of the base layer 115 that are opposite to each other. The first electrically conductive layer 114 and the second electrically conductive layer 116 can be made of cooper or other conductive materials. Then, at Step S702 and as shown in FIG. 8B, the penetration hole 118 is formed and extends through the first electrically conductive layer 114, the base layer 115 and the second electrically conductive layer 116. Next, at Step S703 and as shown in FIG. 8C, the external conductive film 18 is plated on the sidewalls of the penetration hole 118. The external conductive film 18 is electrically connected to the first electrically conductive layer 114 and the second electrically conductive layer 116. That is, the external conductive film 18 can be electrically coupled to the first electrically conductive layer 114 and the second electrically conductive layer 116. Afterwards, at Step S704 and as shown in FIG. 8D, the penetration hole 118 is filled with the thermal decomposable material 17.

Figure 8E:
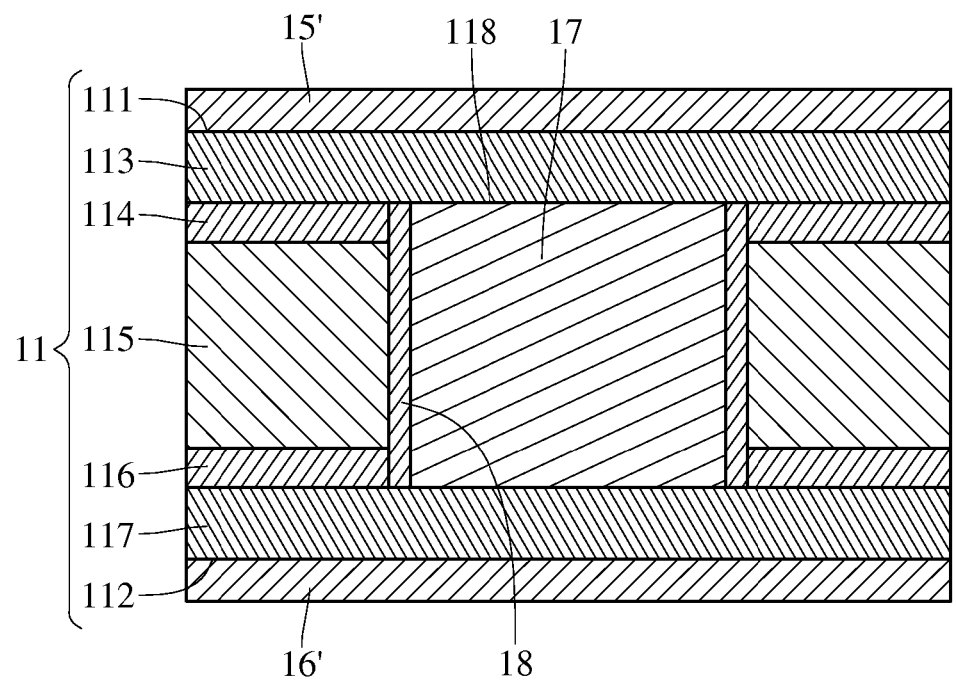

Then, at Step S705 and as shown in FIG. 8E, the first metal layer 15' is disposed on the first insulation layer 113, and then the first insulation layer 113 and the first metal layer 15' are laminated on a side of the first electrically conductive layer 114, which is away from the base layer 115. The second metal layer 16' is disposed on the second insulation layer 117, and then the second insulation layer 117 and the second metal layer 16' are laminated on a side of the second electrically conductive layer 116, which is away from the base layer 115. The first metal layer 15' and the second metal layer 16' can be made of cooper or other conductive materials. In detail, at Step S705, the first metal layer 15' is formed on the first insulation layer 113, and then the first insulation layer 113 and the first metal layer 15' are laminated on the first electrically conductive layer 114. The first electrically conductive layer 114 is disposed between the first insulation layer 113 and the base layer 115, and a part of the first insulation layer 113 is disposed between the first metal layer 15' and the first electrically conductive layer 114. Thus, the first insulation layer 113 covers the first electrically conductive layer 114 and one side of the thermal decomposable material 17. Similarly, the second metal layer 16' is formed on the second insulation layer 117, and then the second insulation layer 117 and the second metal layer 16' are laminated on a side of the second electrically conductive layer 116, which is away from the base layer 115. The second electrically conductive layer 116 is disposed between the second insulation layer 117 and the base layer 115, and a part of the second insulation layer 117 is disposed between the second metal layer 16' and the second electrically conductive layer 116. Thus, the second insulation layer 117 covers the second electrically conductive layer 116 and the other side of the thermal decomposable material 17. The thermal decomposable material 17 is disposed between the first insulation layer 113 and the second insulation layer 117.

Figure 8F:
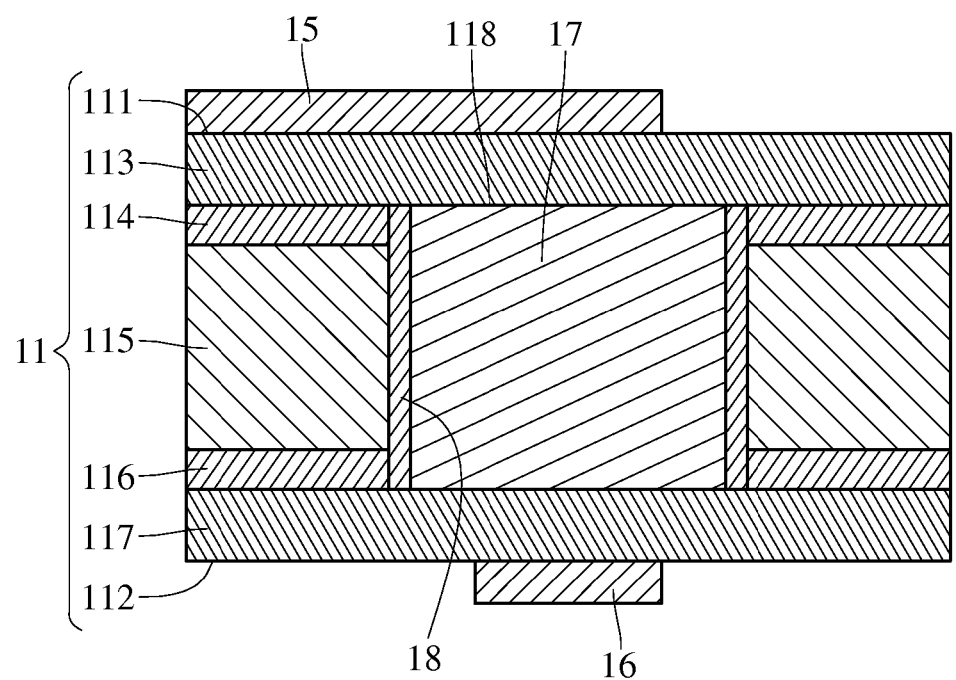
Figure 8G:
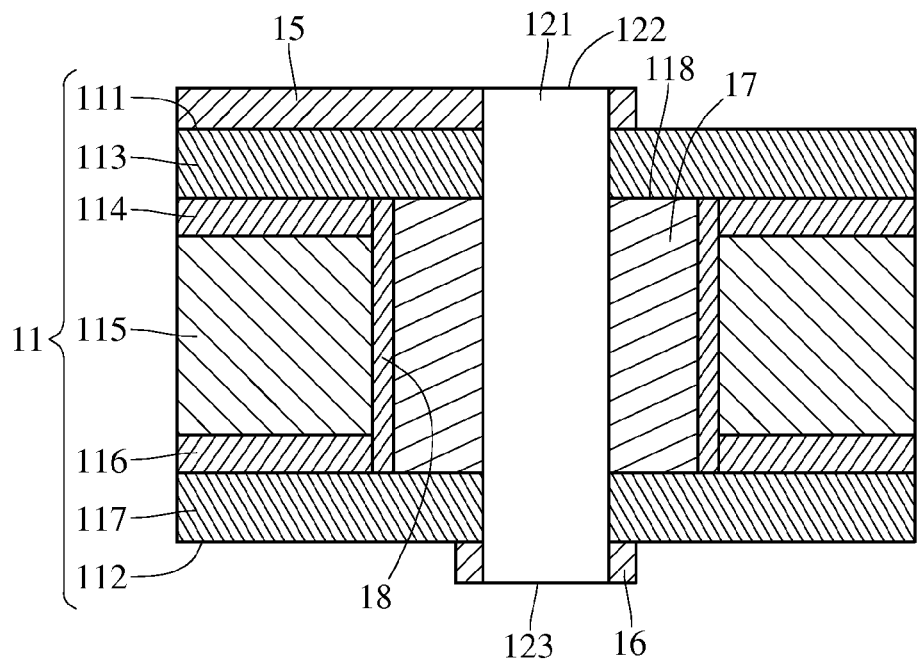
Figure 8H:
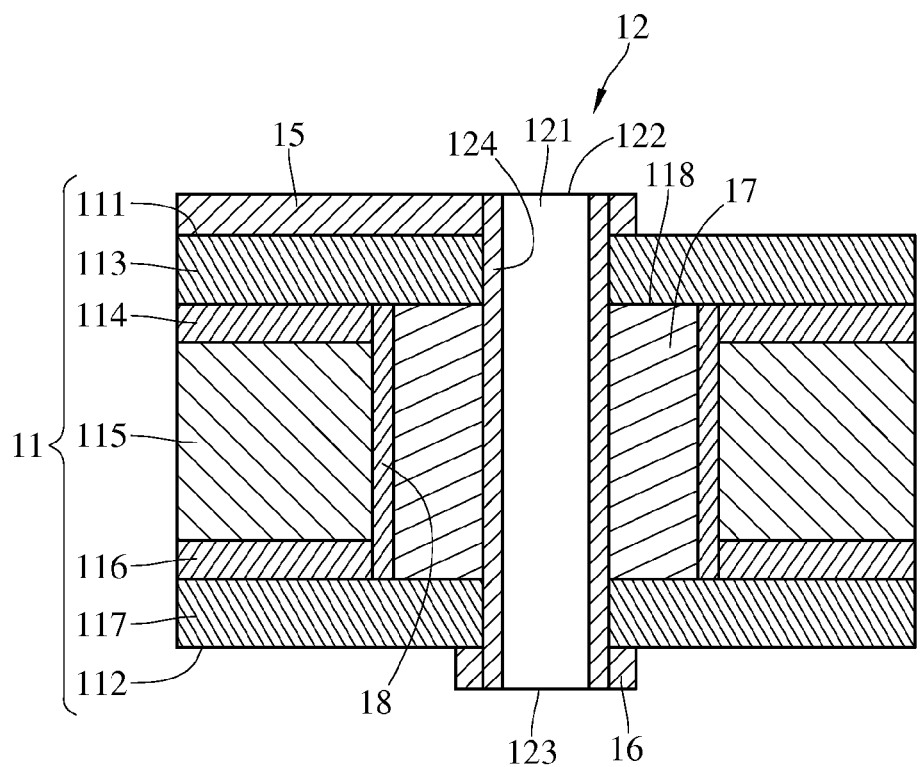
Figure 8I:
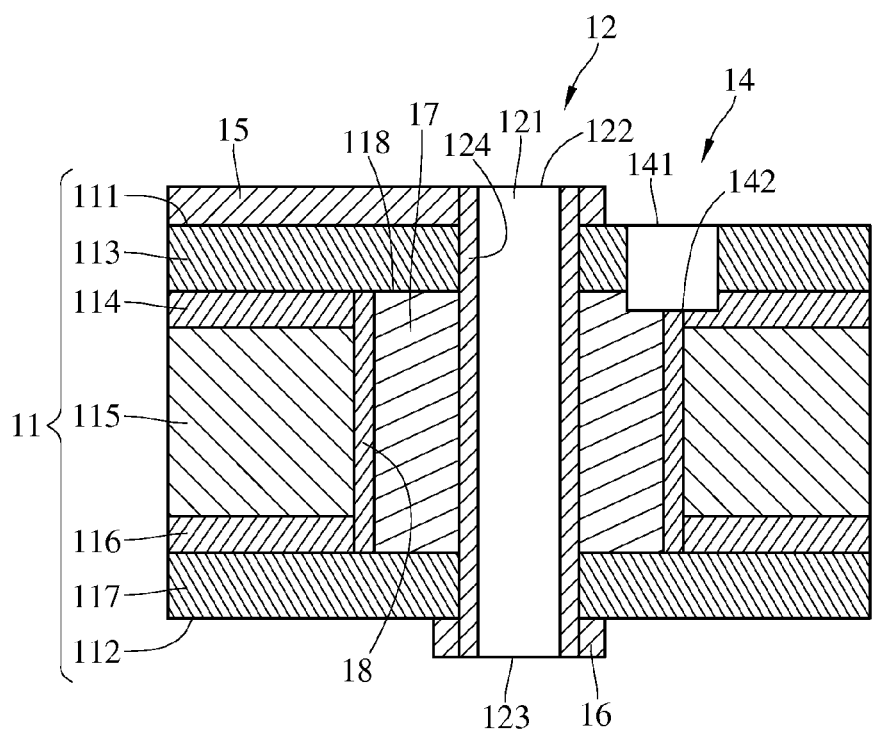
Figure 8J:
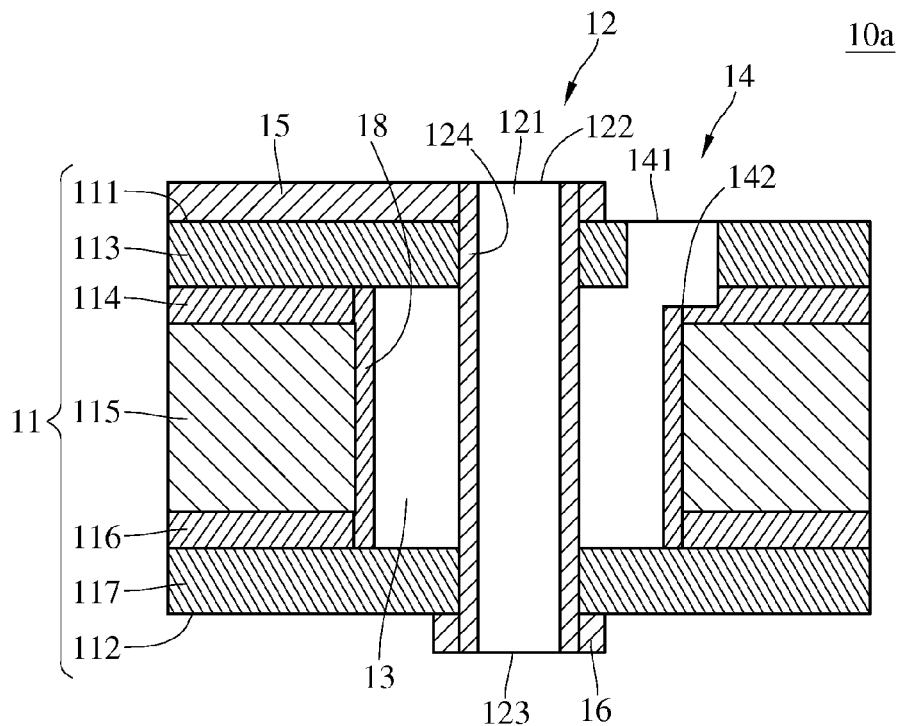

At Step S706 and as shown in FIG. 8F, the first metal layer 15' and the second metal layer 16' are patterned to form the first trace 15 and the second trace 16 according a design of circuitry, which is similar to Step S405 as shown in FIG. 4. For example, the method for pattering includes a general manufacturing method of printed circuit boards and semiconductors, such as, etching, electroplating and deposition. The first trace 15 and the second trace 16 can be made of cooper or other conductive materials. Moreover, Steps S707 through S710 and FIG. 8G through FIG. 8J are similar to Steps S406 through S409 and FIG. 4F through FIG. 4I, so the repeated description is not described again hereinafter.

Figure 9:
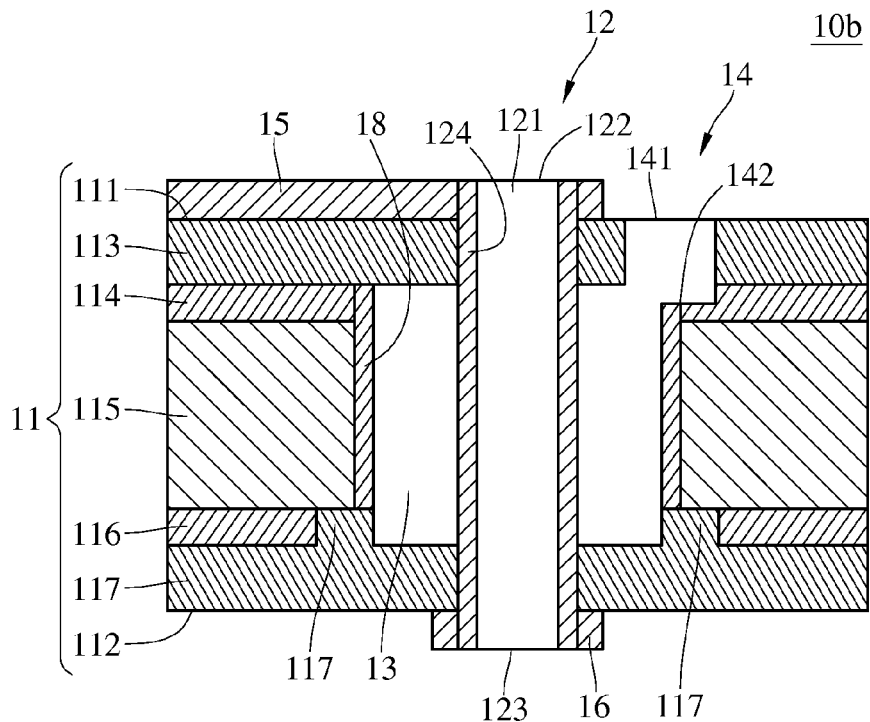
FIG. 9 is a cross-sectional view of a signal transmission board according to yet another embodiment of the disclosure.
Figure 10:
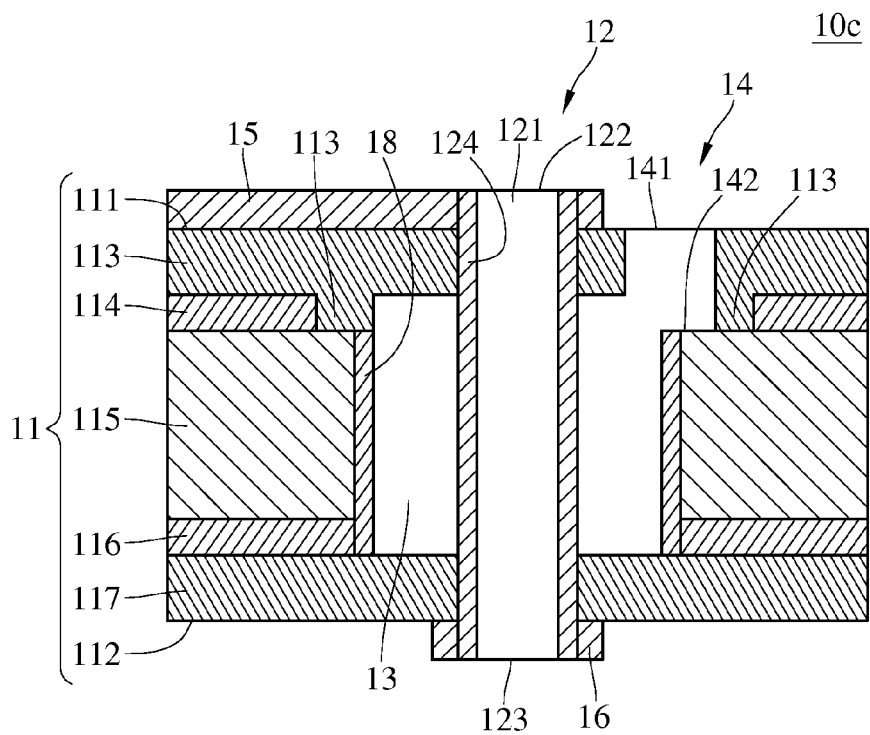
FIG. 10 is a cross-sectional view of a signal transmission board according to yet another embodiment of the disclosure.

Please refer to FIG. 9 and FIG. 10. FIG. 9 is a cross-sectional view of a signal transmission board according to yet another embodiment of the disclosure, and FIG. 10 is a cross-sectional view of a signal transmission board according to yet another embodiment of the disclosure. As shown in the figures, each of the signal transmission boards 10b and 10c includes the substrate 11, the conductive via 12, the cavity 13, the connecting hole 14 and the external conductive film 18 of the signal transmission board 10a shown in FIG. 6. The configurations of the signal transmission boards 10b and 10c are similar to that of the signal transmission board 10a. Compared to the signal transmission board 10a of FIG. 6, the difference is that the external conductive film 18 in this embodiment is only electrically coupled to the first electrically conductive layer 114 or the second electrically conductive layer 116. In the signal transmission board 10b shown in FIG. 9, the external conductive film 18 is electrically coupled to the first electrically conductive layer 114. The external conductive film 18 is electrically insulated from the second electrically conductive layer 116. The external conductive film 18, the first electrically conductive layer 114 and the second electrically conductive layer 116 can be made of cooper or other conductive materials. In the signal transmission board 10c shown in FIG. 10, the external conductive film 18 is electrically coupled to the second electrically conductive layer 116. The external conductive film 18 is electrically insulated from the first electrically conductive layer 114. The external conductive film 18, the first electrically conductive layer 114 and the second electrically conductive layer 116 can be made of cooper or other conductive materials.

Figure 11:
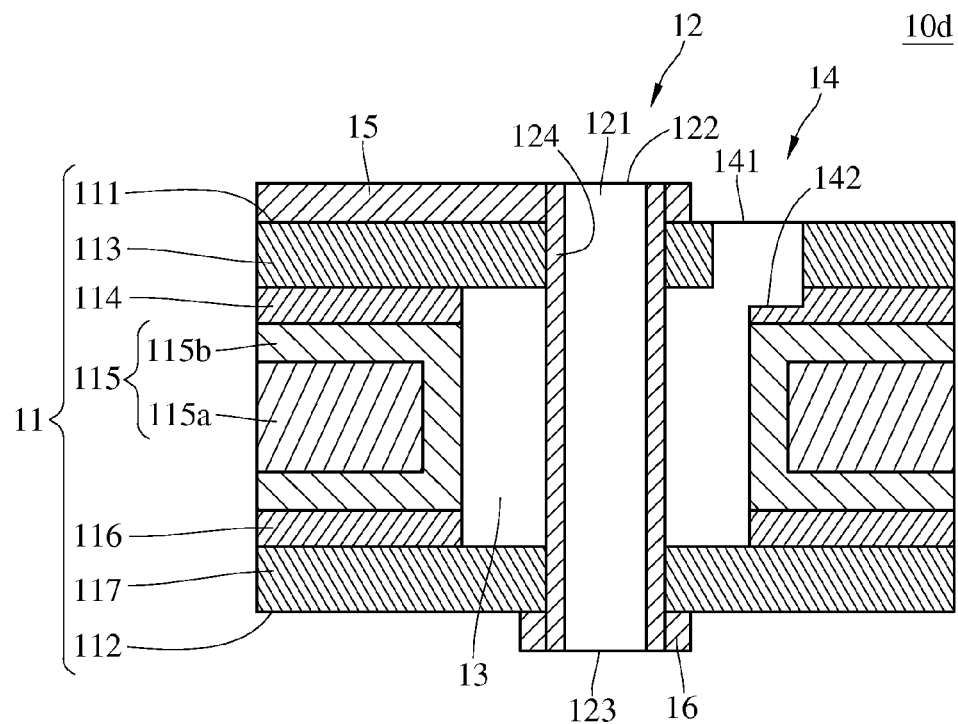
FIG. 11 is a cross-sectional view of a signal transmission board according to yet another embodiment of the disclosure.

Please refer to FIG. 11, which is a cross-sectional view of a signal transmission board according to yet another embodiment of the disclosure. The signal transmission board 10d of FIG. 11 includes the substrate 11, the conductive via 12, the cavity 13 and the connecting hole 14 of the signal transmission board 10 shown in FIG. 1A, and the configuration of the signal transmission board 10d is similar to that of the signal transmission board 10. Compared to the signal transmission board 10 shown in FIG. 1, the base layer 115 of the signal transmission board 10d further includes an inner portion 115a and an external portion 115b. The inner portion 115a is encircled by the external portion 115b. The inner portion 115a is made of a conductive material or a semi-conductive material. The external portion 115b is made of an insulated material. That is to say, an exterior surface of the base layer 115 is made of an insulated material, which is suitable for being applied in the disclosure.

Figure 12:
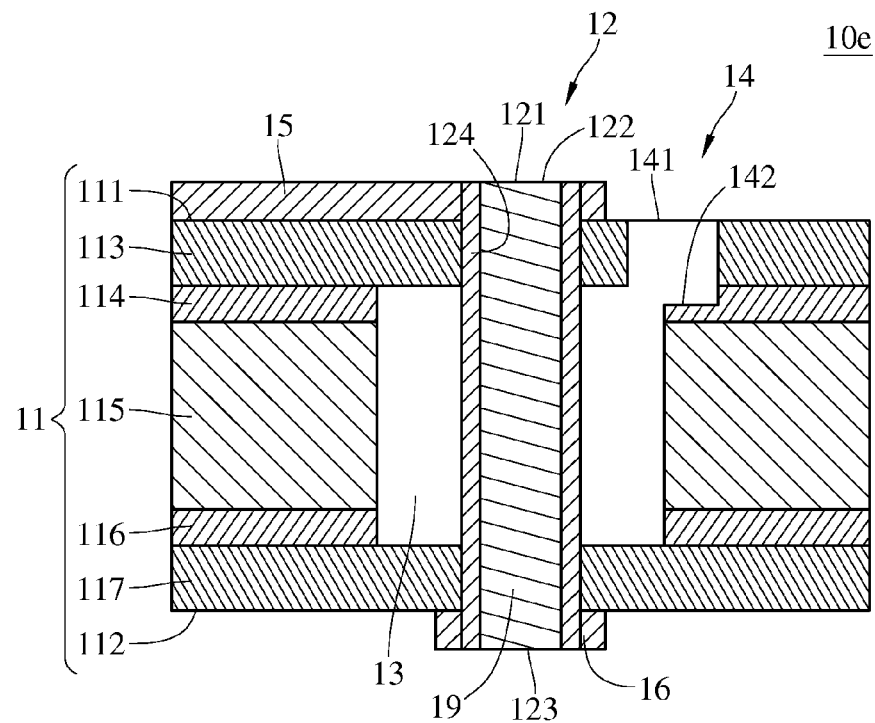
FIG. 12 is a cross-sectional view of a signal transmission board according to yet another embodiment of the disclosure.

Please refer to FIG. 12, which is a cross-sectional view of a signal transmission board according to yet another embodiment of the disclosure. The signal transmission board 10e of FIG. 12 includes the substrate 11, the conductive via 12, the cavity 13 and the connecting hole 14 of the signal transmission board 10 shown in FIG. 1A. The configuration of the signal transmission board 10e is similar to that of the signal transmission board 10. Compared to the signal transmission board 10 shown in FIG. 1A, the difference is that the signal transmission board 10e further includes a filling material 19. The through hole 121 is filled with the filling material 19. The filling material 19 is made of a conductor or insulator. When the through hole 121 is filled with the filling material 19, the structural strength of the conductive via 12 is enhanced.

Figure 13:
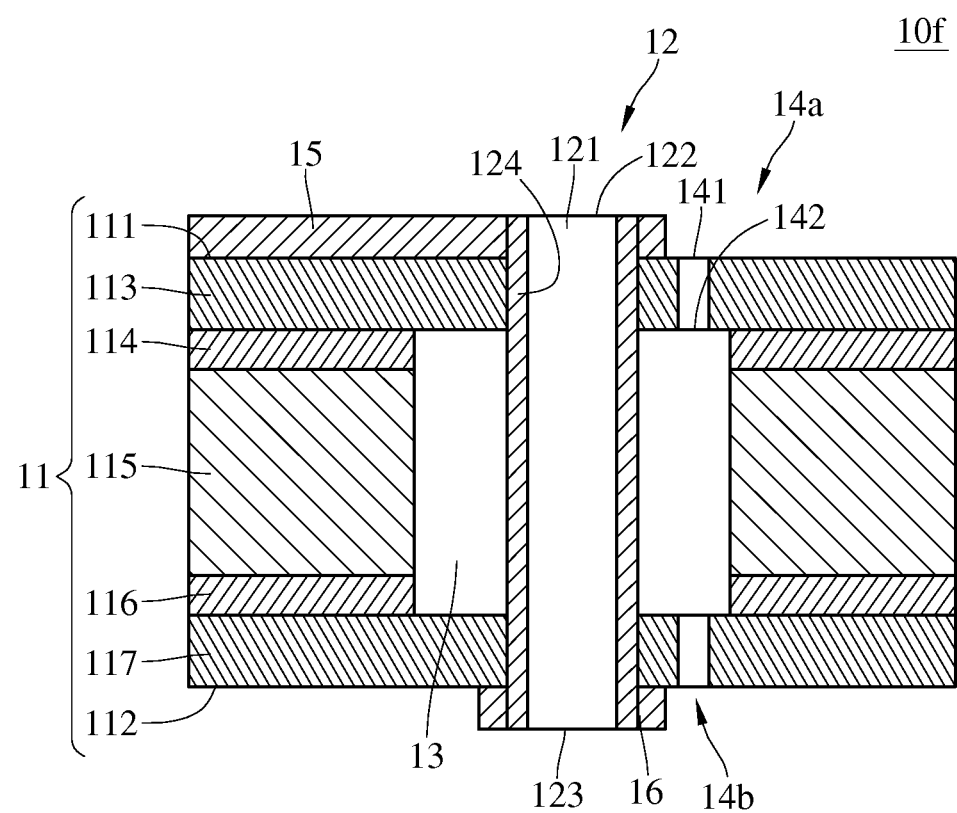
FIG. 13 is a cross-sectional view of a signal transmission board according to yet another embodiment of the disclosure.

Please refer to FIG. 13, which is a cross-sectional view of a signal transmission board according to yet another embodiment of the disclosure. The configuration of the signal transmission board 10f is similar to that of the signal transmission board 10 shown in FIG. 1. The difference between the signal transmission board 10f and the signal transmission board 10 shown in FIG. 1 is that the signal transmission board 10f in this embodiment has two connecting holes 14a and 14b. The opening of the connecting holes 14a and 14b are disposed on the first external surface 111 and the second external surface 112 of the substrate 11, respectively. The connecting hole 14a extends through the first insulation layer 113 to communicate with the cavity 13.

The connecting hole 14b extends through the second insulation layer 117 to communicate with the cavity 13. In this embodiment, the connecting holes 14a and 14b are disposed at the same side of the conductive via 12, but the disclosure is not limited to the positions of the connecting holes 14a and 14b. In other embodiments, the connecting holes 14a and 14b can be disposed at two sides of the conductive via that are opposite to each other. Alternatively, multiple connecting holes 14a and 14b are disposed on the substrate 11.

Summarily, in the signal transmission board, since the connecting hole communicates with the cavity, the thermal decomposable material which is vaporized can be dissipated to the outside of the substrate. Also, the cavity is full of air with the low dielectric constant rather than the dielectric material, and the conductive via is disposed within the cavity. Thus, the characteristic impedance of the conductive via is enhanced. The impedance of the conductive via along the vertical direction matches with the transmission wire, i.e., traces, along the horizontal direction. Since the impedances of paths of signal transmission along the vertical and horizontal directions match with each other, the quality and speed of signal transmission of the signal transmission board are improved when signals transmit through several layers. Furthermore, in other embodiments, the cavity is filled with high dielectric material or the through hole is filled with the filling material, so the signal transmission board can be utilized for a wider variety of applications.

What is claimed is:

1. A signal transmission board, comprising:
    a substrate having a first external surface and a second external surface that are opposite to each other;
    a cavity disposed in the substrate;
    a conductive via having a first end and a second end that are opposite to each other, the conductive via penetrating through the first external surface of the substrate, the cavity and the second external surface of the substrate in sequence, the first end of the conductive via being disposed on the first external surface, and the second end of the conductive via being disposed on the second external surface; and
    a connecting hole having a third end and a fourth end that are opposite to each other, the connecting hole being disposed on the substrate, the third end of the connecting hole being disposed on the first external surface, and the fourth end of the connecting hole communicating with the cavity.

2. The signal transmission board according to claim 1, further comprising one or more first traces and one or more second traces, the first trace being disposed on the first external surface of the substrate and electrically coupled to the first end of the conductive via, and the second trace being disposed on the second external surface of the substrate and electrically coupled to the second end of the conductive via.

3. The signal transmission board according to claim 1, wherein the cavity is separated from the first external surface and the second external surface by distances.

4. The signal transmission board according to claim 1, wherein the substrate comprises, from the first external surface to the second external surface in order, a first insulation layer, a first electrically conductive layer, a base layer, a second electrically conductive layer and a second insulation layer, the first external surface of the first insulation layer is away from the base layer, the second external surface of the second insulation layer is away from the base layer, the cavity is disposed within the first electrically conductive layer, the base layer and the second electrically conductive layer, and the cavity is disposed between the first insulation layer and the second insulation layer.

5. The signal transmission board according to claim 4, wherein the connecting hole extends through the first insulation layer to communicate with the cavity.

6. The signal transmission board according to claim 4, further comprising an external conductive film disposed on a sidewall of the cavity that is formed in the first electrically conductive layer, the base layer and the second electrically conductive layer so as to be electrically coupled to the first electrically conductive layer and the second electrically conductive layer.

7. The signal transmission board according to claim 4, further comprising an external conductive film disposed on a sidewall of the cavity formed in the first electrically conductive layer, the base layer and the second electrically conductive layer, the external conductive film being electrically coupled to the first electrically conductive layer, and the external conductive film being electrically insulated from the second electrically conductive layer.

8. The signal transmission board according to claim 4, further comprising an external conductive film disposed on a sidewall of the cavity formed in the first electrically conductive layer, the base layer and the second electrically conductive layer, the external conductive film being electrically coupled to the second electrically conductive layer, and the external conductive film being electrically insulated from the first electrically conductive layer.

9. The signal transmission board according to claim 4, wherein the base layer further comprises an inner portion and an external portion, the external portion covers the inner portion, the external portion is made of an insulated material, and the inner portion is made of a conductive or a semi-conductive material.

10. The signal transmission board according to claim 4, wherein the base layer is made of an insulated material.

11. The signal transmission board according to claim 4, wherein the cavity is filled with a dielectric material, a dielectric constant of the dielectric material is less than a dielectric constant of the first insulation layer or a dielectric constant of the second insulation layer.

12. The signal transmission board according to claim 11, wherein the dielectric material is air.

13. The signal transmission board according to claim 4, wherein the cavity is filled with a dielectric material, a dielectric constant of the dielectric material is greater than a dielectric constant of the first insulation layer or a dielectric constant of the second insulation layer.

14. A method for manufacturing a signal transmission board, comprising steps of:
    disposing a thermal decomposable material in a substrate with a first external surface and a second external surface, the thermal decomposable material being separated from the first external surface and the second external surface by distances, respectively;
    forming a through hole extending through the substrate and the thermal decomposable material, the through hole having a first end disposed on the first external surface of the substrate and a second end disposed on the second external surface of the substrate;
    plating an inner conductive film on a sidewall of the through hole to form a conductive via;
    forming a connecting hole extending from the first external surface to the thermal decomposable material; and removing the thermal decomposable material through the connecting hole by vaporization so as to form a cavity in the substrate, and the conductive via penetrated through the cavity.

15. The method for manufacturing the signal transmission board according to claim 14, wherein the step of disposing the thermal decomposable material in the substrate further comprises:
    disposing a first electrically conductive layer and a second electrically conductive layer on two sides of a base layer that are opposite to each other, respectively;
    forming a penetration hole extending through the first electrically conductive layer, the base layer and the second electrically conductive layer;
    filling the penetration hole with the thermal decomposable material; and
    disposing a first insulation layer on the first electrically conductive layer, disposing a second insulation layer on the second electrically conductive layer, the thermal decomposable material being disposed between the first insulation layer and the second insulation layer, the first external surface of the first insulation layer being away from the base layer, the second external surface of the second insulation layer being away from the base layer.

16. The method for manufacturing the signal transmission board according to claim 15, before the step of filling the through hole with the thermal decomposable material, further comprising:
    plating an external conductive film on a sidewall of the penetration hole.

17. The method for manufacturing the signal transmission board according to claim 16, wherein the external conductive film is electrically coupled to the first electrically conductive layer and the second electrically conductive layer.

18. The method for manufacturing the signal transmission board according to claim 16, wherein the external conductive film is electrically coupled to the first electrically conductive layer, and the external conductive film is electrically insulated from the second electrically conductive layer.

19. The method for manufacturing the signal transmission board according to claim 16, wherein the external conductive film is electrically coupled to the second electrically conductive layer, and the external conductive film is electrically insulated from the first electrically conductive layer.

20. The method for manufacturing the signal transmission board according to claim 14, after the step of disposing the thermal decomposable material in the substrate, further comprising:
    disposing one or more first traces on the first external surface of the substrate, and disposing one or more second traces on the second external surface of the substrate; and
    patterning the first trace and the second trace.

21. The method for manufacturing the signal transmission board according to claim 20, the inner conductive film is electrically coupled to the first trace and the second trace.

* * * * *